United States Patent [19]
Lane et al.

[11] Patent Number: 5,846,275
[45] Date of Patent: Dec. 8, 1998

[54] CLOG-RESISTANT ENTRY STRUCTURE FOR INTRODUCING A PARTICULATE SOLIDS-CONTAINING AND/OR SOLIDS-FORMING GAS STREAM TO A GAS PROCESSING SYSTEM

[75] Inventors: Scott Lane, Chandler, Ariz.; Mark Holst, Concord, Calif.

[73] Assignee: ATMI EcoSys Corporation, San Jose, Calif.

[21] Appl. No.: 778,386

[22] Filed: Dec. 31, 1996

[51] Int. Cl.$^6$ ............................ B01D 35/00; B01D 51/00; B65G 53/18

[52] U.S. Cl. ............................ 55/431; 55/522; 55/523; 96/355; 96/372; 96/379; 261/112.1; 406/46; 406/48; 406/193

[58] Field of Search ..................... 55/242, 257.1, 55/261, 266, 431, 466, 522, 523, DIG. 32; 95/279, 280, 281; 406/46, 47, 48, 89, 172, 193; 261/112.1; 96/355, 372, 379

[56] References Cited

U.S. PATENT DOCUMENTS

| | | |
|---|---|---|
| 2,530,716 | 11/1950 | Meynier . |
| 2,545,028 | 3/1951 | Haldeman . |
| 2,551,114 | 5/1951 | Goddard . |
| 2,580,013 | 12/1951 | Gazda . |
| 2,857,979 | 10/1958 | Dijck . |
| 2,873,818 | 2/1959 | Veres . |
| 3,097,936 | 7/1963 | Lincoln . |
| 3,871,305 | 3/1975 | Watanabe et al. . |
| 3,888,955 | 6/1975 | Maruko . |
| 3,918,917 | 11/1975 | Ashina et al. . |
| 4,054,424 | 10/1977 | Staudinger et al. ............ 55/261 |
| 4,068,625 | 1/1978 | Brown . |
| 4,083,607 | 4/1978 | Mott ............................... 55/DIG. 32 |
| 4,116,491 | 9/1978 | Ply ................................. 406/89 |
| 4,172,708 | 10/1979 | Wu et al. ........................ 55/261 |
| 4,479,809 | 10/1984 | Johnson et al. ................. 55/261 |
| 4,874,559 | 10/1989 | Brun . |
| 4,902,303 | 2/1990 | Den Bleyker . |
| 4,986,838 | 1/1991 | Johnsgard . |
| 5,113,789 | 5/1992 | Kamian . |
| 5,118,286 | 6/1992 | Sarin . |
| 5,252,007 | 10/1993 | Klinzing et al. ............... 406/193 |
| 5,575,636 | 11/1996 | Kobayashi et al. . |

FOREIGN PATENT DOCUMENTS

| | | | |
|---|---|---|---|
| 92155 | 1/1962 | Denmark .................................. 406/89 |
| 578373 | 6/1933 | Germany ................................ 406/193 |
| 2140520 | 2/1972 | Germany .................................. 406/89 |
| 42 11 138 A | 10/1993 | Germany .................................. 406/47 |
| 541748 | 3/1977 | Russian Federation ................ 406/89 |
| 650128 | 2/1951 | United Kingdom ..................... 406/48 |
| 680460 | 10/1952 | United Kingdom ..................... 406/89 |
| 2 258 203 | 2/1993 | United Kingdom ..................... 406/89 |
| WO 95/00425 | 1/1995 | WIPO ....................................... 406/47 |

OTHER PUBLICATIONS

Abrea, et al., Causes of anomalous solid formation in the exhaust system of low–pressure chemical vapor deposition plasma enhanced chemical vapor deposition semiconductor processes, J. Vac. Sci. Technol B 12(4) Jul./Aug. 1994, pp. 2763–2767.

*Primary Examiner*—C. Scott Bushey
*Attorney, Agent, or Firm*—Steven J. Hultquist; Oliver A. M. Zitzmann

[57] ABSTRACT

A clog-resistant inlet structure for introducing a particulate solids-containing and/or solids-forming gas stream to a gas processing system, including: a gas-permeable wall enclosing a gas flow path, and an outer annular jacket circumscribing the gas-permeable wall to define an annular gas reservoir therebetween; and a flow passage for introducing a gas into the annular gas reservoir during the flow of the particulate solids-containing and/or solids-forming gas stream to a gas processing system through such inlet structure at a pressure sufficient to cause the gas to permeate through the gas-permeable wall to combat the deposition or formation of solids on the interior surface of the gas-permeable wall. The inlet structure may further optionally include a downstream annular section in which the wall surface bounding the gas stream is blanketed with a falling liquid film, to combat solids deposition or formation on the blanketed wall surface.

21 Claims, 1 Drawing Sheet

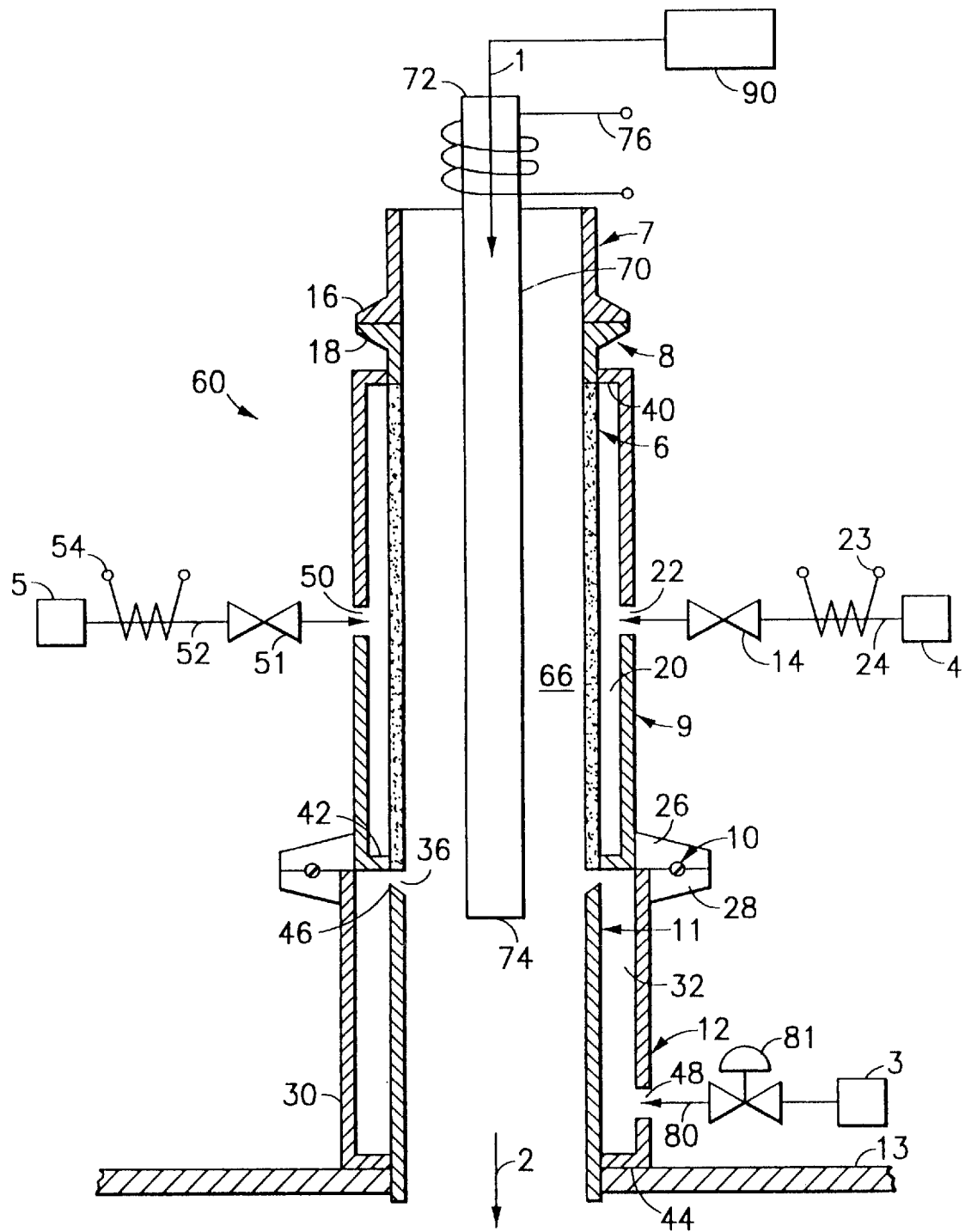
FIG.

CLOG-RESISTANT ENTRY STRUCTURE FOR INTRODUCING A PARTICULATE SOLIDS-CONTAINING AND/OR SOLIDS-FORMING GAS STREAM TO A GAS PROCESSING SYSTEM

BACKGROUND OF THE INVENTION

1. Field of the Invention

This invention relates to a clogging-resistant entry structure for introducing a particulate solids-containing and/or solids-forming gas stream to a gas processing system.

2. Description of the Related Art

In the processing of particulate solids-containing and/or solids-forming gas streams for treatment thereof, clogging of inlet structures of process equipment with particulate solids from such streams is frequently a problem. As the particulate solids-containing and/or solids-forming gas stream is flowed through the process equipment, solids may be deposited on the surfaces and in the passages of the inlet structure.

In general, particulates associated with the gas stream can come from various sources, including: (i) particulate generated in an upstream process unit which comes downstream to the inlet structure with the gas stream; (ii) particulate formed in the system lines by the reaction of a process gas component with oxygen from leaks coming into the lines; (iii) particulate formed in the system lines due to reaction of two or more process off-gases during flow of the gas stream coming downstream to the inlet structure; (iv) particulate formed by (partial) condensation of off-gases coming downstream to the inlet structure; and (v) particulate formed by reaction of process gases with back-diffusing oxygen or water vapor from a downstream gas stream treatment unit such as for example a downstream water scrubber. In some instances, where the particulate is formed by condensation, it may be possible to ameliorate the problem by heating of process lines, to eliminate the condensable portion of the gas stream. Even with such line heating, however, the problems of particulate from other sources still remain.

Particularly in the field of semiconductor manufacture, inlet clogging is prone to occur from: (a) back-migration to the inlet of water vapor as a combustion product of downstream oxidation operations and/or water scrubbing operations employed to treat the gas stream, causing hydrolysis reactions in a heterogeneous or homogeneous fashion with incoming water-sensitive gases such as $BCl_3$ or $WF_6$; (b) thermal degradation of incoming thermally-sensitive gases; and (c) condensation of incoming gases due to transition points in the system.

The aforementioned inlet clogging problems may require the incorporation of plunger mechanisms or other solids removal means to keep the inlet free of solids accumulations, however these mechanical fixes add considerable expense and labor to the system. In other instances, the inlet clogging problems may be systemic and require periodic preventative maintenance to keep the inlet free of solids accumulations. Such maintenance, however, requires shut-down of the system and loss of productivity in the manufacturing or process facility with which the inlet is associated.

Considering specifically the occurrence of water vapor backstreaming from a downstream water scrubber to an upstream inlet structure in a semiconductor process effluent gas stream treatment system, wherein water vapor released from the scrubber migrates back from the scrubber inlet toward the process tool, against the normal direction of gas flow, various mechanisms may be involved in the transport of the back-migration of the water vapor.

One mechanism is gas-gas interdiffusion. The only practical way of avoiding this source of water vapor back migration is to add a diffusion boundary to the water scrubber inlet.

Another mechanism for such back-diffusion of water vapor is the so-called Richardson annular effect. All dry pumps create a certain amount of pressure oscillation in the gas flow stream. These pressure oscillations create a counterflow transport mechanism that pumps gases against the direction of normal gas flow. This phenomenon is a consequence of the boundary layer annular effect. Because of this effect, the backflow migration velocity is greatest a small distance away from the wall surface.

If particulate solids continue to accumulate with continued operation of process equipment, the inlet structure of such equipment may become occluded to sufficient extent as to plug entirely, or alternatively the solids build-up may not occlude the inlet of the process unit, but may so impair the flows and increase the pressure drop in the system as to render the process equipment grossly inefficient for its intended purpose.

Particularly in the case of water scrubber equipment used for scrubbing of gas streams such as waste gas streams generated in the manufacture of semiconductor devices, the waste gas constituting the influent gas stream to the water scrubber may contain or produce (by reaction or condensation) significant fine particles content, e.g., submicron particles of silica, metals from CVD or other deposition operations, etc. Such waste gas streams tend to clog the inlet of the waste gas water scrubber very readily. As a result the inlet of the water scrubber requires manual cleaning on a frequent basis.

The inlet clogging susceptibility is a major shortcoming of current commercial water scrubber units used in the semiconductor industry. The time required to clog the entry of the water scrubber in such applications is process dependent and site-specific. Among the factors that affect the mean time to failure of the water scrubber due to the clogging of the inlet include: the process tool generating the particulates-containing process effluent stream being treated in the scrubber, the specific process recipes and chemistries employed in the upstream process generating the effluent being treated in the water scrubber, and the character of the inert gas purges used to purge pumps and process lines in the system. Other process conditions and factors are suspected of contributing to or affecting particle build-up in the process system, but are not yet clearly defined. See Abreu, R., Troup, A. and Sahm, M., "Causes of anomalous solid formation in the exhaust systems of low-pressure chemical vapor deposition and plasma enhanced chemical vapor deposition semiconductor processes, J. Vac. Sci. Technol. B 12 (4), July/August 1994, 2763–2767.

It would therefore be a significant advance in the field and is accordingly an object of the present invention to provide an improved inlet structure for a process unit, such as a water scrubber unit, which is resistant to clogging.

It is another object of the present invention to provide such an inlet structure which in addition to being highly resistant to clogging by particulate solids is readily removable from the process equipment with which it is employed, for cleaning purposes.

It is a still further object of the present invention to provide such an inlet structure which is significantly self-cleaning in character.

Other objects and advantages of the invention will be more fully apparent from the ensuing disclosure and appended claims.

SUMMARY OF THE INVENTION

In a broad aspect, the present invention relates to a clog-resistant inlet structure for introducing a particulate solids-containing and/or solids-forming gas stream to a gas processing system.

The inlet structure may for example comprise a gas-permeable wall enclosing a gas flow path, and an outer annular jacket circumscribing the gas-permeable wall to define an annular gas reservoir therebetween. The outer annular jacket is provided with means for introducing a gas into the annular gas reservoir during the flow of the particulate solids-containing and/or solids-forming gas stream to a gas processing system through such inlet structure, e.g., a port in the jacket for attachment of a pressurized gas source vessel such as a conventional pressurized gas cylinder. In such structure, the gas supplied to the annular gas reservoir is at relatively low pressure, being only sufficiently pressurized to "bleed" through the gas-permeable wall for the purpose of combatting the deposition or formation of solids on the interior surface of the gas-permeable wall.

As a further variant, the inlet structure described above may further optionally comprise a port for introducing a pulsed higher pressure gas into the annular reservoir, with the port being coupled with a source of higher pressure gas and means for pulsed delivery thereof from the source to the annular reservoir. In operation, such pulsed higher pressure gas introduction effects additional anti-clogging action on the gas-permeable wall, with the pulsatility serving to dislodge particulates that may form or otherwise deposit on the inner surface of the gas-permeable wall even with the lower pressure gas being constantly permeated though the wall. The port on the outer annular jacket may be constructed and arranged to provide a tangential flow of higher pressure gas into the annular reservoir.

As yet another variant of the inlet structure broadly described above, the gas-permeable wall and outer annular jacket may optionally be coupled to a downstream flow path section including a wall enclosing a corresponding further section of the gas flow path and forming with the gas permeable wall a slot therebetween. The wall of the downstream flow path section is circumscribed by an outer annular jacket to define an annular liquid reservoir therebetween in liquid overflow relationship with the slot so that when the annular liquid reservoir is filled with water or other liquid beyond a certain point determined by the height of the wall, the liquid flows over the wall and down the interior surface of the wall, as a falling liquid film thereon. Such falling liquid film thus provides a barrier or blanketing medium on the wall interior surfaces, to resist solids deposition or formation on such interior surfaces, and also serves to wash away any solids which nonetheless are deposited or formed on the interior surface of the wall.

The outer annular jacket of the downstream flow path section of the inlet structure may be provided with a port or other ingress means, coupled to a source of liquid, e.g., a vessel containing such liquid by a line or conduit containing a flow control valve or other flow-regulating means.

The port elements in the above-described structures may comprise a unitary opening, channel, feed-through, nipple, or other ingress structure, and/or a multiplicity of same, e.g., a series of vertically and/or circumferentially spaced apart ingress structures through which the fluid in each case is transferred into the interior volume of the annular reservoir with which the ports are associated.

In another aspect, the inlet structure of the invention comprises first and second generally vertically arranged flow passage sections in serial coupled relationship to one another, defining in such serial coupled relationship a generally vertical flow passage through which the particulate solids-containing fluid stream may be flowed, from an upstream source of the particulate solids-containing fluid to a downstream fluid processing system arranged in fluid stream-receiving relationship to the inlet structure.

The first flow passage section is an upper section of the inlet structure and includes an inner gas-permeable wall which may be formed of a porous metal or porous ceramic, or other suitable material of construction, enclosing a first upper part of the flow passage. The porous inner wall has an interior surface bounding the upper part of the flow passage.

The gas-permeable wall is enclosingly surrounded by an outer wall in spaced apart relationship to the porous inner wall. The outer wall is not porous in character, but is provided with a low pressure gas flow port. By such arrangement, there is formed between the respective inner porous wall and outer enclosing wall an interior annular volume.

The low pressure gas flow port in turn may be coupled in flow relationship to a source of low pressure gas for flowing such gas at a predetermined low rate, e.g., by suitable valve and control means, into the interior annular volume, for subsequent flow of the low pressure gas from the interior annular volume into the flow passage. A high pressure gas flow port is also provided in the outer wall of the first flow passage section, coupled in flow relationship to a source of high pressure gas for intermittent flowing of such gas into the interior annular volume, such high pressure gas flow serving to clean the inner porous wall of any particulates that may have deposited on the inner surface thereof (bounding the flow passage in the first flow passage section). The high pressure gas may likewise be controllably flowed at the desired pressure by suitable valve and control means.

The second flow passage section is serially coupled to the first flow passage section, for flowing of particulate solids-containing fluid downwardly into the second flow passage section from the first flow passage section. The second flow passage includes an outer wall having a liquid injection port therein, which may be coupled with a source of liquid such as water or other process liquid. The outer wall is coupleable with the first flow passage section, such as by means of matable flanges on the respective outer walls of the first and second flow passage sections. The second flow passage includes an inner weir wall in spaced apart relationship to the outer wall to define an interior annular volume therebetween, with the inner weir wall extending toward but stopping short of the inner porous wall of the first flow passage section, to provide a gap between such respective inner walls of the first and second flow passage sections, defining a weir. When liquid is flowed into the interior annular volume between the outer wall of the second flow passage section and the inner wall thereof, the introduced liquid overflows the weir and flows down the interior surface of the inner wall of the second flow passage section. Such flow of liquid down the inner wall serves to wash any particulate solids from the wall and to supress the deposition or formation of solids on the interior wall surface of the inner wall.

The flanged connection of the first and second flow passage sections with one another may include a quickrelease clamp assembly, to accommodate ready disassembly of the respective first and second flow passage sections of the inlet structure.

Further, the first flow passage section of the inlet structure may be joined to an uppermost inlet structure quick-disconnect inlet section, which likewise may be readily disassembled for cleaning and maintenance purposes.

Other aspects, features and embodiments of the invention will be more fully appreciated from the ensuing disclosure and appended claims.

BRIEF DESCRIPTION OF THE DRAWING

FIG. 1 is a schematic representation of a clogging-resistant inlet structure according to an illustrative embodiment of the present invention.

DETAILED DESCRIPTION OF THE INVENTION AND PREFERRED EMBODIMENTS THEREOF

Referring now to the drawings, FIG. 1 is a schematic representation of a clogging-resistant inlet structure according to an illustrative embodiment of the present invention.

The inlet structure is shown in FIG. 1 as being connectable to process piping for coupling the inlet structure with a source of the gas stream being introduced to such inlet structure. Such upstream piping may be suitably heat-traced in a conventional manner, from the upstream source of the gas stream, e.g., a semiconductor manufacturing tool, to the inlet flange on the inlet structure as shown. The purpose of such heat-tracing is to add sufficient energy to the gas stream in the piping to prevent components of such gas stream from condensing or subliming in the inlet structure.

The inlet structure 60 shown in FIG. 1 comprises an inlet section 7 including an inlet flange 16. The inlet flange is matably engageable with the flange 18 of upper annular section 8 which terminates at its upper end in such flange. The inlet section may be coupled with an upstream particulate solids-containing and/or particulate solids-forming stream generating facility 90, as for example a semiconductor manufacturing tool.

The annular section 8 comprises an inner porous wall 6 which is of appropriate porosity to be gas-permeable in character, and an outer solid wall 9 defining an annular interior volume 20 therebetween. The interior surface of the inner porous wall 6 thus bounds the flow passage 66 in the upper annular section 8. The outer solid wall 9 at its upper and lower ends is enclosed in relation to the inner wall 6, by means of the end walls 40 and 42 to enclose the annular interior volume. The outer wall 9 is provided with a low pressure gas inlet port 22 to which is joined a low pressure gas feed line 24. The low pressure gas feed line 24 is connected at its outer end to a source 4 of low pressure gas. A check valve 14 is disposed in the low pressure gas feed line 24, to accommodate the flow of low pressure gas into the annular interior volume 20. The feed line 24 may also be provided with other flow control means (not shown) for selectively feeding the low pressure gas from the source 4 into the annular interior volume 20 in a desired amount and at a desired flow rate, in the operation of the system.

The upper annular section 8 may also be provided with an optional high pressure gas injection port 50 to which is joined high pressure gas feed line 52 joined in turn to high pressure gas supply 5. The gas feed line is shown with a flow control valve 51 therein, which may be joined to flow controller means (not shown) for operating the flow control valve 51 in accordance with a predetermined sequence. The high pressure gas feed line 52 alternatively may be disposed at any suitable angle in relation to the high pressure gas injection port 50, e.g., at an oblique angle.

The optional high pressure gas injection port 50 and high pressure gas feed line 52 are advantageous if solids accumulation occurs on the interior wall surface of the gas-permeable wall, despite the constant flux (or "bleed-through") of the lower pressure gas introduced in line 24 to the annular interior volume 20.

The upper annular section 8 terminates at its lower end in a flange 26 which mates and engages with flange 28 of the lower annular section 30. The flanges 26 and 28 may be sealed by the provision of a sealing means such as the O-ring 10 shown in FIG. 1.

The lower annular section 30 includes an outer wall 12 terminating at its upper end in the flange 28. The outer wall is a jacket member which at its lower end is joined to the inner weir wall 11 by means of the end wall 44, to form an annular interior volume 32 between the outer wall 12 and the inner weir wall 11. The inner weir wall 11 extends vertically upwardly as shown but terminates at an upper end 46 in spaced relation to the lower end of inner porous wall 6 of upper annular section 8, so as to form a gap 36 therebetween defining an overflow weir for the lower annular section 30.

The outer wall 12 of the lower annular section 30 is provided with a water inlet port 48 to which may be joined a water feed line 80 joined to water supply 3 having liquid flow control valve 81 therein which may be operatively coupled with other flow control means for maintaining a desired flow rate of liquid to the lower annular section 30.

At its lower end, the lower annular section 30 may be suitably joined to the housing of the water scrubber 13. The water scrubber may be constructed in a conventional manner for conducting scrubbing abatement of particulates and solubilizable components of the process stream. Alternatively, the inlet structure 60 may be coupled to any other processing equipment for treatment or processing of the gas stream passed through the inlet structure, from the inlet end to the discharge end thereof.

Thus, there is provided by the inlet structure 60 a gas flow path 66 through which influent gas may flow in the direction indicated by arrow "1" in FIG. 1 to the discharge end in the direction indicated by arrow "2" in FIG. 1.

In operation, particulate solids-containing gas is introduced from an upstream source, such as a semiconductor manufacturing tool (not shown) by means of suitable connecting piping, which as mentioned hereinabove may be heat-traced to suppress deleterious sublimation or condensation of gas stream components in the inlet structure. The stream enters the inlet structure 60 in the flow direction indicated by arrow "1" and passes through the inlet section 7 and enters the upper annular section 8. Low pressure gas, such as nitrogen, or other gas, is flowed from source 4 through low pressure gas feed line 24 connected to port 22, and enters the annular interior volume 20. From the annular interior volume 20 the introduced low pressure gas flows through the gas-permeable wall 6, into the interior gas flow passage 66. The particulate-containing gas thus flows through the interior gas flow passage 66 and into the water scrubber 13, as the low pressure gas from gas feed line 24 flows into the annular interior volume 20 and through the gas-permeable wall 6.

In this manner, the annular interior volume 20 is pressurized with the low pressure gas from the source 4. Such pressure ensures a low, steady flow of the low pressure gas through the porous wall into the interior gas flow passage 66. Such low flow rate, steady flow of the gas through the gas-permeable wall maintains the particulates in the gas stream flowing through the interior gas flow passage 66 away from the interior wall surfaces of the inlet structure. Further, any gases present with the gas flow stream in the interior flow passage 66 are likewise kept away from the interior wall surfaces of the inlet structure.

The low pressure gas feed line 24 can if desired be heat traced. Such heat tracing may be desirable if the gas stream flowing through the inlet structure contains species that may condense or sublimate and deposit on the walls of the inlet structure.

Concurrently, high pressure gas from high pressure gas supply 5 may be periodically flowed through high pressure gas feed line 52 through high pressure gas injection port 50 to the annular interior volume 20. For this purpose, the line 52 may have a flow control valve (not shown) therein, to accommodate the pulsed introduction of the high pressure gas. In this manner, the high pressure gas is injected into the annular interior volume at specified or predetermined intervals, in order to break away any particle buildup on the inner surface of the gas permeable wall 6. The duration and time sequencing of the pulsed introduction of the high pressure gas may be readily determined without undue experimentation within the skill of the art, to achieve the desired wall scouring effect which will prevent solids accumulation on the gas permeable wall surfaces. If required, when the inlet structure is employed in connection with a water scrubber servicing a semiconductor manufacturing tool, such high pressure injections may be interrupted during the tool batch cycle in order to eliminate pressure fluctuations at the tool exhaust port by suitable integration of control means operatively linked to the tool control system. For this purpose, a control valve such as a solenoid valve may be appropriately coupled with control means of the tool assembly.

In the inlet structure embodiment shown, the flanges 26 and 28 may be clamped to one another to permit quick disconnection of the upper annular section 8 from the lower annular section 30. For such purpose, a quick-disconnect clamp may be employed. The sealing gasket 10 between flanges 26 and 28 may be formed of a suitable material such as a corrosion resistant, high temperature elastomer material. This elastomeric gasket additionally functions as a thermal barrier to minimize heat transfer from the upper annular section to the lower annular section of the inlet structure, a feature which is particularly important in heat traced embodiments of the invention.

The gas permeable wall 6 of the upper annular section of the inlet structure may be formed of any suitable gas-permeable material, e.g., ceramics, metals and metal alloys, and plastics. As a specific example, the wall may be formed of a Hastelloy 276 material. The outer wall 9 of the upper annular section may likewise be formed of any suitable material, and may for example be a thin walled stainless steel pipe.

The lower annular section 30 of the inlet structure may be formed of any suitable material such as a polyvinylchloride plastic. Water is injected into the annular interior volume 32 between the outer wall 12 and the inner weir wall 11 through line 50 from water supply 3. Preferably, the water is injected tangentially, to allow the angular momentum of the water in the annular interior volume 32 to cause the water to spiral over the top end 46 of the weir wall 11 and down the interior surface of the weir wall in the interior flow passage 66 of the inlet structure. Such water flow down the interior surface of the weir wall 11 is employed to wash any particulates down the flow passage 66 to the water scrubber 14 below the inlet structure. As mentioned, the lower annular section 30 is an optional structural feature which may be omitted, e.g., when the downstream process unit is a combustion scrubber.

The pressure drop through the inlet structure can be readily determined by pressure tapping the exhaust pipe from the upstream process unit and the scrubber unit downstream of the inlet structure. The pressure drop can be sensed with a Photohelic gauge or other suitable pressure sensing gauge and such pressure drop reading can be sent to suitable monitoring and control equipment to monitor clogging in the scrubber inlet.

By the use of the inlet structure in accordance with the present invention, an interface may be provided between the water scrubber and the tool exhaust stream from a semiconductor manufacturing operation, that does not clog repeatedly in normal process operation. The inlet structure of the present invention provides an interface with two ancillary process streams, a steady low flow purge stream and a high pressure pulse stream. The low flow purge stream creates a net flux of inert gas, e.g., nitrogen, away from the inner surface of the upper annular section toward the centerline of the central flow passage 66. The high pressure gas flow stream provides a self-cleaning capability against solids clogging. The high pressure gas flow is employed to eliminate any particle buildup on the inlet structure upper annular section interior surfaces of the central flow passage 66.

Gases, entrained particles, and previously deposited particles are then directed into the overflow stream at the inner wall surface in the lower annular section of the inlet structure, to be flushed down into the water scrubber downstream of the inlet structure. In this manner a direct interface between the gas permeable wall of the upper annular section and the weir wall of the lower annular section of the inlet structure, providing a highly efficient inlet conformation which effectively minimizes the buildup of particulate solids in operation.

The inlet structure of the invention has a number of advantages. In application to a semiconductor manufacturing facility and water scrubber treatment system for processing of waste gas effluents from a tool in the semiconductor process facility, the exhaust gas from the semiconductor tool can be heated continuously all the way from the tool exhaust port to the water interface in the water scrubber inlet structure. Heat tracing on the inlet lines can be used to heat the lines by conducting energy into the piping, which transfers energy to the flowing gas stream by convection. Process gas may be heated all the way down to the overflow weir wall of the lower annular section of the inlet structure by heat tracing the low pressure gas flow line which flows low pressure gas to the upper annular section, as well as by heat tracing the high pressure gas flow line feeding pulsed high pressure gas to the interior annular volume of the upper annular section of the inlet structure. Such flow of heated gas will maintain the process gas flowing through the central flow passage of the inlet structure at a temperature which is determined by the vapor pressure of any particulate forming gas in the gas stream flowing to the inlet structure from the upstream process unit that would otherwise condense or sublimate and deposit on the walls of the inlet structure.

Another advantage of the inlet structure of the present invention is that such structure may be readily disassembled. In the event that the inlet structure does clog in operation, the structure is easily taken apart by simply removing the clamps or other securement elements holding the flanges of the inlet structure to one another. The upper annular section may thus be replaced by removing the clamps holding the respective flanges in position, and by disconnecting the respective gas feed lines that feed the upper annular section.

A still further advantage of the inlet structure of the present invention is that it is self-cleaning in character. Particles that have been entrained in the gas stream flowing to the inlet structure from the upstream process unit or that have been formed by chemical reaction in the inlet structure can be readily cleaned from the gas-permeable wall of the inlet structure by the pulsed high pressure gas injection into the interior annular volume in the upper annular section of the inlet structure. The particles that are then dislodged from the interior wall surfaces of the upper annular section of the inlet structure then are directed to the overflow portion of the weir wall where such particulate solids are flushed to the downstream scrubber. The pressure, duration and periodicity of the high pressure gas pressure pulses can be easily set to accommodate the prevailing system particulate concentration conditions and character of such solids. The effectiveness of the pulsed high pressure gas injection will depend on the character of the particulate solids. The inlet structure of the present invention therefore is self-cleaning in nature, without the use of scraper or plunger devices typical of the so-called self-cleaning apparatus of prior art fluid treatment systems.

The material specification of the porous wall element of the upper annular section of the inlet structure is dependent on the incoming process gas from the upstream process unit. If the gas stream includes acid gas components, such gases will be absorbed in the water scrubber and will be present in water which is recirculated to the overflow weir wall in the lower annular section of the inlet structure. It is possible that some of the overflow weir wall water will splash up on the porous inner wall of the upper annular section of the inlet structure. The porous wall in such instance is desirably selected from corrosion-resistant materials of construction. A preferred metal material for such purpose is Hastelloy 276 steel, which exhibits excellent corrosion resistance under low temperature hydrous acid conditions.

Another advantage of the inlet structure of the present invention is that it minimizes the backflow of water vapor from the top of the water scrubber into the process piping when the inlet structure is employed upstream of a water scrubber as illustratively described herein. By way of explanation of this advantage, it is to be appreciated that particulates may be present in the exhaust streams of some semiconductor tools as either entrained particulates from the process tool, or as the reactants of a chemical reaction within the gas stream's flow path.

The present invention minimizes or eliminates the previously described Richardson annular effect. Due to the steady outflow of low pressure gas at the inner surface of the porous wall of the upper annular section of the inlet structure, the static boundary layer condition at the inner wall surface of the upper annular section cannot develop. There is a net flux of flowing gas from the gas-permeable wall which acts to "push" the process gas flow away from the wall bounding the central flow passage of the inlet structure, and avoids the presence of a static boundary condition, thereby avoiding the Richardson annular effect. Accordingly, if particles are formed as a result of chemical reaction in the flow stream, the thus-formed particles do not find a wall on which to agglomerate. The particles instead will flow with the gas stream into the water scrubber. The same is true for entrained particles. Once the particles reach the top of the inlet, they will become entrained in the gas flow stream because they will not have a wall on which to collect.

By opposing the conditions which give rise to the Richardson annular effect, the porous wall in the upper annular section of the inlet structure of the present invention serves as an effective barrier to the back migration of water vapor to the exhaust lines of the process system. Any back migration will be exceedingly slow due to the aforementioned interdiffusion mechanism. This factor will greatly increase the mean time to failure for the scrubber, since the scrubber entry and exhaust lines will not clog as often with the inlet structure of the present invention.

Although the porous wall member of the upper annular section of the inlet structure of the invention has been described herein as being constructed of a metal material, it will be appreciated that such gas-permeable wall may be formed of any suitable material of construction. For example, the porous wall may be formed of a porous ceramic, plastic (e.g., porous polyethylene, polypropylene, polytetrafluoroethylene, etc.), or other material having the capability to withstand the corrosive atmospheres, temperature extremes, and input pressures that may be present in the use of the inlet structure of the present invention.

While the invention has been described herein in the embodiment shown illustratively in the Figure as comprising respective discrete upper and lower annular sections which are coupled to one another, as for example by flanges and associated quick-disconnect clamps or other interconnection means, it will be appreciated that such inlet structure may be formed as a unitary or integral structure, as may be desired or necessary in a given end use application of the present invention, and that the lower annular section is an optional section to the upper annular section, and may be unnecessary in some instances.

Thus, while the invention has been described herein with reference to specific variations, modifications and embodiments of the invention, it will be appreciated that the invention is not thus limited but extends to variations, modifications and embodiments other than those specifically disclosed, and the invention is therefore to be broadly construed and interpreted as encompassing all such variations, modifications and other embodiments, within its spirit and scope.

What is claimed is:

1. A clog-resistant inlet structure for introducing a gas stream to a gas processing system, wherein said gas stream comprises gas selected from the group consisting of solids-containing gas, solids-forming gas, and mixtures thereof, and wherein said inlet structure comprises:

a gas-permeable wall enclosing a gas flow path, and an outer annular jacket circumscribing the gas-permeable wall to define an annular gas reservoir therebetween;

means for introducing a low pressure gas into the annular gas reservoir, during the flow of the gas stream to a gas processing system through such inlet structure, at a positive pressure sufficient to cause the low pressure gas to permeate in a steady flow through the gas-permeable wall to combat the deposition or formation of solids on the interior surface of the gas-permeable wall; and means for periodically injecting a high pressure gas into the annular gas reservoir during the flow of the gas steam through the inlet structure, to scour the gas-permeable wall enclosing the gas flow path for prevention of solids accumulation thereon.

2. An inlet structure according to claim 1, wherein the means for periodically injecting the high pressure gas comprise a high pressure gas flow port for introducing the high pressure gas into the annular reservoir, wherein the port is coupled with a source of the high pressure gas and means for pulsed delivery thereof from the source to the annular reservoir, to exert additional anti-clogging action on the gas-permeable wall.

3. A clog-resistant inlet structure for introducing a gas stream to a gas processing system, wherein said gas stream comprises gas selected from the group consisting of solids-containing gas, solids-forming gas, and mixtures thereof, and wherein said inlet structure comprises:

a gas-permeable wall enclosing a gas flow path, and an outer annular jacket circumscribing the gas-permeable wall to define an annular gas reservoir therebetween;

means for introducing a gas into the annular gas reservoir, during the flow of the gas stream to a gas processing system through such inlet structure, at a pressure sufficient to cause the gas to permeate through the gas-permeable wall to combat the deposition or formation of solids on the interior surface of the gas-permeable wall, wherein the gas-permeable wall and outer annular jacket are coupled to a downstream flow path section including a wall enclosing a corresponding further section of the gas flow path and forming with the gas permeable wall a slot therebetween, with the wall of the downstream flow path section being circumscribed by an outer annular jacket to define an annular liquid reservoir therebetween in liquid overflow relationship with the slot so that when the annular liquid reservoir is filled with liquid beyond a certain point determined by the height of the wall, the liquid flows over the wall and down the interior surface of the wall, as a falling liquid film thereon, whereby the falling liquid film provides a barrier medium on the wall interior surface, to resist solids deposition or formation on such interior surface, and to wash away any solids which nonetheless are deposited or formed on the interior surface of the wall.

4. An inlet structure according to claim 3, wherein the outer annular jacket of the downstream flow path section of the inlet structure is provided with a liquid injection port coupled to a supply of liquid therefor.

5. An inlet structure according to claim 1, wherein a first end of the gas flow path is coupled in gas flow relationship with a semiconductor manufacturing tool.

6. An inlet structure according to claim 5, wherein a second end of the gas flow path is coupled in gas flow relationship with a water scrubber unit.

7. An inlet structure according to claim 5, wherein a second end of the gas flow path is coupled in gas flow relationship with a combustion scrubber unit.

8. A clog-resistant inlet structure for introducing a gas stream to a gas processing system, wherein said gas stream comprises gas selected from the group consisting of solids-containing gas, solids-forming gas, and mixtures thereof, and wherein said inlet structure comprises:

first and second generally vertically arranged flow passage sections in serial coupled relationship to one another, defining in such serial coupled relationship a generally vertical flow passage through which the gas stream may be flowed, from an upstream source of the gas stream to a downstream gas processing system arranged in gas stream-receiving relationship to the inlet structure;

said first flow passage section comprising an upper section of the inlet structure and including an inner gas-permeable wall having an interior surface bounding an upper part of the flow passage, and an outer wall enclosingly surrounding the gas-permeable wall to define an interior annular volume therebetween;

a low pressure gas flow port in the outer wall of the first flow passage section, said low pressure gas flow port being coupleable to a source of low pressure gas for flowing of low pressure gas at a predetermined flow rate into the interior annular volume, for subsequent flow of low pressure gas from the interior annular volume into the flow passage of the inlet structure;

the second flow passage section being serially coupled to the first flow passage section, for flowing of particulate solids-containing fluid downwardly into the second flow passage section from the first flow passage section, said second flow passage including an outer wall having a liquid injection port therein, said second flow passage section outer wall being coupled with the first flow passage section, and an inner weir wall in spaced apart relationship to the outer wall to define an interior annular volume therebetween, with the inner weir wall extending toward but terminating short of the gas-permeable wall of the first flow passage section, to provide a gap therebetween defining a weir, and with said weir wall having an interior surface bounding the flow passage in the second flow passage section;

whereby when liquid is flowed into the interior annular volume between the outer wall of the second flow passage section and the inner weir wall thereof, the introduced liquid overflows the weir and flows down the interior surface of the inner wall of the second flow passage section to wash any particulate solids from the wall and to suppress the deposition or formation of solids on the interior surface of the inner weir wall, as the particulate solids-containing gas stream is flowed through the flow passage of the inlet structure.

9. An inlet structure according to claim 8, further comprising a high pressure gas flow port in the outer wall of the first flow passage section, said high pressure gas flow port being coupleable to a source of high pressure gas for flowing of high pressure gas into the interior annular volume, to clean the gas-permeable wall of particulates depositing or forming thereon.

10. An inlet structure according to claim 8, wherein a source of low pressure gas is coupled to the low pressure gas port in the outer wall of the first flow passage section.

11. An inlet structure according to claim 9, wherein a source of high pressure gas is coupled to the high pressure gas flow port in the outer wall of the first flow passage section.

12. An inlet structure according to claim 8, wherein a lower end of the second flow passage section is joined to a water scrubber for scrubbing of the particulate solids-containing gas stream flowed through the flow passage of the inlet structure.

13. An inlet structure according to claim 8, wherein the first and second flow passage sections are quick disconnectably coupled with one another.

14. An inlet structure according to claim 8, wherein the first flow passage section and second flow passage section are coaxially aligned with one another.

15. An inlet structure according to claim 1, wherein the gas permeable wall is formed of a porous metal.

16. An inlet structure according to claim 1, wherein the gas permeable wall is formed of a porous ceramic.

17. An inlet structure according to claim 1, wherein the gas permeable wall is formed of a porous plastic.

18. An inlet structure according to claim 1, wherein the gas permeable wall and outer annular jacket are of circular cross-section.

19. An inlet structure according to claim 8, wherein the outer wall and inner weir wall of the second flow passage section are of circular cross-section.

20. An inlet structure according to claim 8, wherein the first flow passage section is joined to an upstream semiconductor manufacturing tool.

21. A clog-resistant inlet structure for introducing a gas stream to a gas processing system, wherein said gas stream comprises gas selected from the group consisting of solids-containing gas, solids-forming gas, and mixtures thereof, and wherein said inlet structure comprises:

a gas-permeable wall enclosing a gas flow path, and an outer annular jacket circumscribing the gas-permeable wall to define an annular gas reservoir therebetween;

a low pressure gas flow port connectable to a low pressure gas supply for introducing a low pressure gas into the annular gas reservoir, during the flow of the gas stream to a gas processing system through such inlet structure, at a pressure sufficient to cause the low pressure gas to permeate in a steady flow through the gas-permeable wall, to combat the deposition or formation of solids on the interior surface of the gas-permeable wall;

a downstream flow passage section including a wall with an interior surface enclosing a corresponding downstream section of the gas flow path, said downstream flow path section wall being joined to the gas-permeable wall; and means for providing on the downstream flow passage section wall interior surface a falling liquid film, to combat the deposition or formation of solids thereon;

wherein the gas-permeable wall and downstream flow passage section wall are of circular-cross section and equal in diameter to one another.

* * * * *

UNITED STATES PATENT AND TRADEMARK OFFICE
CERTIFICATE OF CORRECTION

PATENT NO : 5,846,275

DATED : December 8, 1998

INVENTOR(S) : Scott Lane and Mark Holst

It is certified that error appears in the above-identified patent and that said Letters Patent are hereby corrected as shown below:

On the title page item [56],
Foreign Patent Documents, page 1, "4211 138A" should be --DE 4211 138 A--
and "2 258 203" should be --2 258 203A--

Column 6, line 18: "ajacket member" should be --a jacket member--

Signed and Sealed this

Thirtieth Day of March, 1999

Attest:

Q. TODD DICKINSON

Attesting Officer

Acting Commissioner of Patents and Trademarks